(12) United States Patent
Horiuchi et al.

(10) Patent No.: US 7,605,383 B2
(45) Date of Patent: Oct. 20, 2009

(54) PATTERN WRITING APPARATUS USING CHARGED PARTICLE BEAM, AND PROGRAM-RECORDED READABLE RECORDING MEDIUM

(75) Inventors: Tomoyuki Horiuchi, Shizuoka (JP); Takeshi Kurohori, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 271 days.

(21) Appl. No.: 11/840,761

(22) Filed: Aug. 17, 2007

(65) Prior Publication Data

US 2008/0067431 A1 Mar. 20, 2008

(30) Foreign Application Priority Data

Sep. 14, 2006 (JP) .............................. 2006-249142

(51) Int. Cl.
*G21K 5/00* (2006.01)
*G03F 9/00* (2006.01)
*G06F 19/00* (2006.01)

(52) U.S. Cl. .............................. 250/492.22; 250/492.2; 250/492.1; 250/492.3; 250/398; 430/296; 430/942; 430/30

(58) Field of Classification Search ............ 250/492.22, 250/492.2, 492.1, 492.3, 398; 430/296, 942, 430/30
See application file for complete search history.

(56) References Cited

U.S. PATENT DOCUMENTS

| 2008/0011965 A1* | 1/2008 | Matsukawa et al. ......... 250/398 |
| 2008/0067423 A1* | 3/2008 | Kimura et al. ........... 250/492.1 |
| 2008/0078947 A1* | 4/2008 | Horiuchi et al. ......... 250/492.2 |
| 2008/0235535 A1* | 9/2008 | Sakai et al. .................. 714/10 |

FOREIGN PATENT DOCUMENTS

JP 10-242027 9/1998

OTHER PUBLICATIONS

U.S. Appl. Np. 12/406,390, filed Mar. 18, 2009, Goshima.

* cited by examiner

*Primary Examiner*—Nikita Wells
(74) *Attorney, Agent, or Firm*—Oblon, Spivak, McClelland, Maier & Neustadt, L.L.P.

(57) ABSTRACT

A charged particle beam pattern writing apparatus includes an input part for inputting a predetermined command, a check part for checking a state of a predetermined function used for pattern writing using a charged particle beam, based on the predetermined command, and an output part for outputting the state of the predetermined function which has been checked.

13 Claims, 12 Drawing Sheets

PATTERN WRITING APPARATUS USING CHARGED PARTICLE BEAM, AND PROGRAM-RECORDED READABLE RECORDING MEDIUM

CROSS-REFERENCE TO RELATED APPLICATION

This application is based upon and claims the benefit of priority from the prior Japanese Patent Application No. 2006-249142 filed on Sep. 14, 2006 in Japan, the entire contents of which are incorporated herein by reference.

FIELD OF THE INVENTION

The present invention relates to a pattern writing apparatus using a charged particle beam, and a computer-readable recording medium with a program of the apparatus recorded thereon. For example, it relates to an electron beam writing method of irradiating electron beams onto a target workpiece while variably shaping the electron beams, an apparatus used for the method, and a program for controlling the apparatus.

DESCRIPTION OF RELATED ART

Microlithography technology which forwards miniaturization of semiconductor devices is extremely important, because only this process performs forming a pattern in semiconductor manufacturing processes. In recent years, with an increase in high integration and large capacity of LSI, a critical dimension of a circuit required for semiconductor elements is becoming narrower and narrower. In order to form a desired circuit pattern on these semiconductor devices, a high precision master pattern (also called a mask or a reticle) is needed. Then, as the electron beam technology for writing or "drawing" a pattern has excellent resolution intrinsically, it is used for manufacturing such high precision master patterns.

FIG. 15 shows a schematic diagram for explaining operations of a conventional variable-shaped electron beam pattern writing apparatus. The variable-shaped electron beam pattern writing apparatus (EB (Electron beam) writing apparatus) operates as follows. As shown in the figure, the pattern writing apparatus includes two aperture plates. A first or "upper" aperture plate 410 has an opening or "hole" 411 in the shape of a rectangle for shaping an electron beam 330. This shape of the rectangular opening may also be a square. A second or "lower" aperture plate 420 has a specially shaped opening 421 for shaping the electron beam 330 having passed through the opening 411 of the first aperture plate 410 into a desired rectangle or triangle. The electron beam 330 that left a charged particle source 430 and has passed through the opening 411 is deflected by a deflector. Then, the electron beam 330 passes through part of the specially shaped opening 421 of the second aperture plate 420, and reaches a target workpiece 340 mounted on a stage that is continuously moving in a predetermined direction (e.g. X-axis direction). In other words, a rectangular shape capable of passing through both of the opening 411 and the specially shaped opening 421 is written or "drawn" in a pattern writing area of the target workpiece 340 mounted on the stage. This method of writing or "forming" a given variable shape by letting beams pass through both of the opening 411 and the specially shaped opening 421 is called a variable shaped beam (VSB) system.

In the electron beam pattern writing apparatus, when the state of the apparatus is changed by periodic maintenance, updating of the control program of the apparatus, debugging, etc., it becomes necessary to check operations concerning the changed contents. In that case, when performing an operation test, the time needed for the test can be shortened if a dummy mode is used for a function which is not necessary for the operation check test.

With respect to the writing function, a technique is disclosed that checks a calculation processing function of processing figure data by comparing figure data processed by dummy writing of actually irradiating no electron beam and reference figure data precisely processed by previous simulation. (Refer to, e.g., Japanese Published Unexamined Patent Application No. 10-242027)

As mentioned above, when performing an operation check concerning the changed contents, the check test time can be shortened if a dummy mode is used for a function which is not necessary for the operation check test. Therefore, actually, there is a case of using a dummy mode for a function which is not necessary for the test in performing the operation check test concerning the changed contents. Then, in that case, when releasing the apparatus to a customer after the operation check test, all the dummy modes need to be restored to the normal or real mode, because it is necessary to normally execute each function as a pattern writing apparatus that is generally provided with a large number of functions.

In the conventional pattern writing apparatus, checking whether each function is in a dummy mode or not has to be performed manually. Consequently, there is a problem that there may be a lot of checking mistakes and a pattern writing apparatus with a dummy mode may be released to a customer. This is because the pattern writing apparatus is generally provided with many functions each of which is usually executed by software, the state of each function is not clearly specified, thereby becoming difficult to perform checking. Moreover, when a large number of functions are provided, items to be checked are various and therefore checking omission may easily occur. Specially, when checking whether a function is in a dummy mode or not is performed by another person different from the user who changed the function to a dummy mode, it is hard to know the respects having been changed. Furthermore, in many cases, since different functions are executed respectively in two or more computers, it is needed to perform checking at the two or more computers. Moreover, there is a case that the user himself/herself who changed the function to a dummy mode may forget to restore it from the dummy mode.

As a result of actually performing pattern writing while a dummy mode is included in the apparatus, a writing error or a pattern error occurs because of the function in a dummy mode, and therefore it takes a long time before actually starting required writing. Thus, it is requested to eliminate such loss.

BRIEF SUMMARY OF THE INVENTION

It is an object of the present invention to provide a method of automatically checking whether a function of a pattern writing apparatus is in a dummy mode or in a real mode.

In accordance with one aspect of the present invention, a charged particle beam pattern writing apparatus includes an input part configured to input a predetermined command, a check part configured to check a state of a predetermined function used for pattern writing using a charged particle beam, based on the predetermined command, and an output part configured to output the state of the predetermined function which has been checked.

In accordance with another aspect of the present invention, a computer-readable recording medium with a program recorded causes a computer to execute processes of inputting a predetermined command, storing it in a first storage device, reading the predetermined command from the first storage device, checking a state of a predetermined function used for pattern writing using a charged particle beam, based on the predetermined command, storing the state of the predetermined function which has been checked in at least one of the first storage device and a second storage device, and displaying the state of the predetermined function which has been checked on a monitor.

DETAILED DESCRIPTION OF THE INVENTION

In the following Embodiments, structures utilizing an electron beam as an example of a charged particle beam will be described. The charged particle beam is not restricted to the electron beam, and may be the one using a charged particle, such as an ion beam.

Embodiment 1

Figure 1:
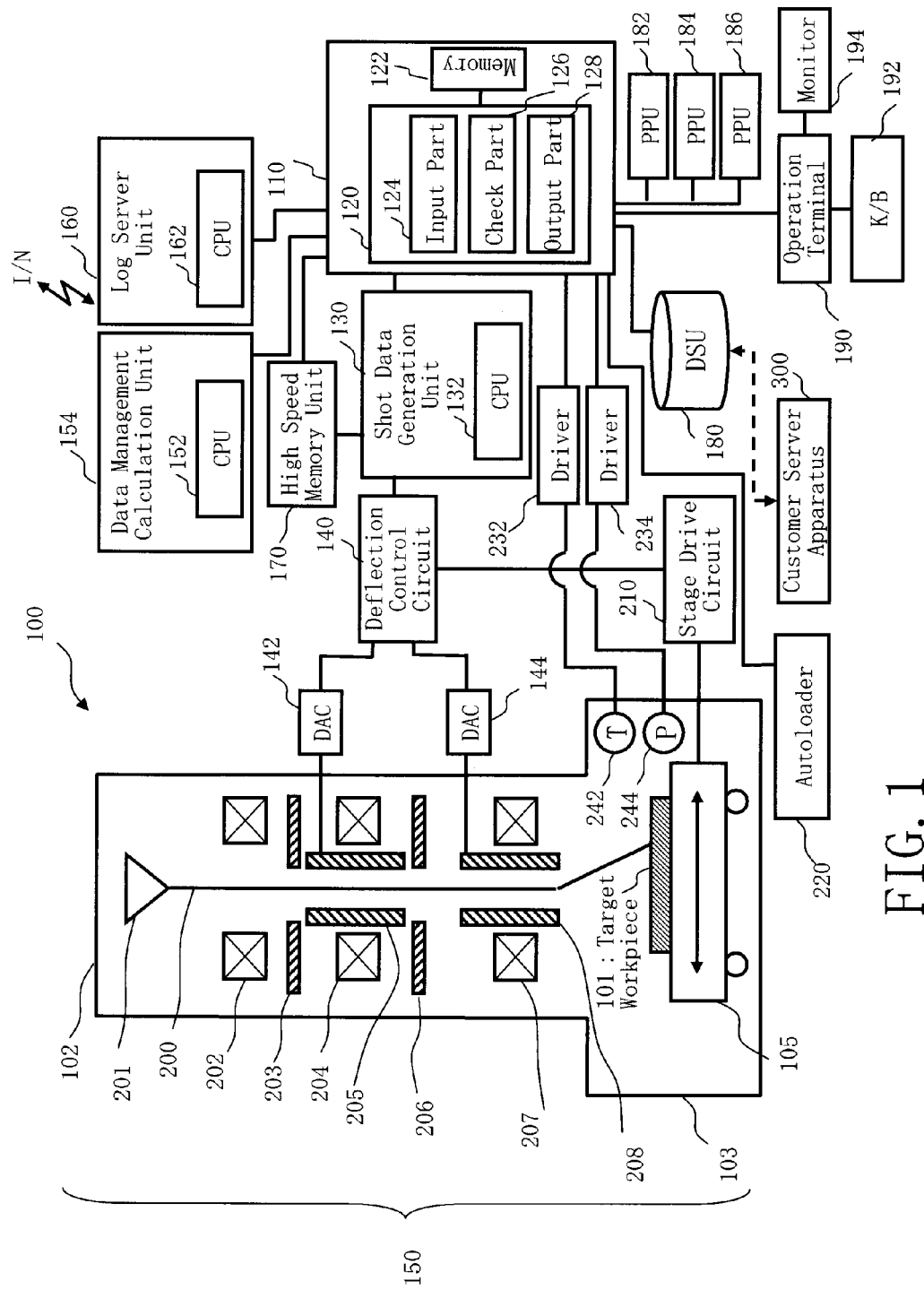
FIG. 1 is a schematic diagram showing a structure of a pattern writing apparatus described in Embodiment 1.

FIG. 1 is a schematic diagram showing the structure of a pattern writing apparatus described in Embodiment 1. In the figure, a pattern writing apparatus 100 writes a predetermined pattern on a target workpiece 101 which includes a mask for manufacturing a semiconductor device. The pattern writing apparatus 100 serving as an example of a charged particle beam pattern writing apparatus includes a pattern writing part 150 and a control system. The pattern writing part 150 includes an electron lens barrel 102 and a writing chamber 103. In the electron lens barrel 102, an electron gun assembly 201, an illumination lens 202, a first aperture plate 203, a projection lens 204, a deflector 205, a second aperture plate 206, an objective lens 207, and a deflector 208 are arranged. Moreover, in the writing chamber 103, an XY stage 105 is arranged, and the target workpiece 101 to be written is laid or "placed" on the XY stage 105.

The control system includes a writing control unit (WCU) 110, a shot data generation unit (SDG) 130, a deflection control circuit (deflection control part) (DEF) 140, a digital analog converter (DAC) 142, a DAC 144, a data management calculation unit (ESP: Early Stage Pre-processing unit) 154, a log server unit 160, a high speed memory unit (HSU: High-speed Shared Storage Unit) 170, a hard disk drive unit (DSU: Data Storage Unit) 180, parallel calculation units (PPU: Parallel Processing Units) 182, 184, and 186, an operation terminal 190, a keyboard (K/B) 192, a monitor 194, a stage drive circuit 210, an autoloader 220, a driver 232, a temperature sensor 242, a driver 234, and a pressure sensor 244. The writing control unit 110, the shot data generation unit 130, the deflection control circuit 140, the data management calculation unit 154, the log server unit 160, the high speed memory unit 170, the hard disk drive unit 180, and the parallel calculation units 182, 184, and 186 are examples of a unit device.

The writing control unit 110 includes a CPU 120 and a memory 122. The CPU 120 serving as a computer includes functions, such as an input part 124, a check part 126, and an output part 128. Input data, output data, etc. calculated by the CPU 120 is stored in the memory 122. Each of the functions of the input part 124, the check part 126, and the output part 128 is configured by software whose processing is executed by the computer (CPU 120). However, it should not be limited thereto. For example, they may be configured by hardware of an electric circuit. Alternatively, they may be executed by a combination of hardware of an electric circuit and software, or a combination of hardware and firmware.

Moreover, the shot data generation unit 130 includes a CPU 132 serving as a computer. The data management calculation unit 154 includes a CPU 152 serving as a computer. The log server unit 160 includes a CPU 162 serving as a computer. A PPU 182, a PPU 184, and a PPU 186 include CPUs (not shown) serving as computers.

The writing control unit 110, the shot data generation unit 130, the data management calculation unit 154, the log server unit 160, the high speed memory unit 170, the hard disk drive unit 180, the PPU 182, the PPU 184, and the PPU 186 are mutually connected through a bus (not shown). The operation terminal 190, the autoloader 220, the driver 232, and the driver 234 are connected to the writing control unit 110 through a bus (not shown). The writing control unit 110, the deflection control circuit 140 and the high speed memory unit 170 are connected to the shot data generation unit 130 through a bus (not shown). The DAC 142, the DAC 144, and the stage drive circuit 210 are connected to the deflection control circuit 140 through a bus (not shown). The DAC 142 is connected to the deflector 205 and the DAC 144 is connected to the deflector 208. The K/B 192 and the monitor 194 are connected to the operation terminal 190 through a bus (not shown). The driver 232 is connected to the temperature sensor 242, and the driver 234 is connected to the pressure sensor 244. Moreover, a customer server apparatus 300 is connected to the hard disk drive unit 180 through a bus (not shown). FIG. 1 depicts structure elements necessary for describing Embodiment 1, and other structure elements may be included in the pattern inspection apparatus 100.

The target workpiece 101 is conveyed onto the XY stage 105 by the autoloader 220. An electron beam 200, leaving the electron gun assembly 201, is irradiated or "shot" by the illumination lens 202 onto the whole of a rectangular opening, for example, which is formed in the first aperture plate 203. At this point, the electron beam 200 is shaped to be a desired rectangle, for example. Then, after having passed through the first aperture plate 203, the electron beam 200 of a first aperture image is guided by the projection lens 204 to reach the second aperture plate 206. The position of the first aperture image on the second aperture plate 206 is deflected and controlled by the deflector 205 which is controlled by the deflection control circuit 140 through the DAC 142, and thereby the shape and size of the beam can be changed. After having passed through the second aperture plate 206, the electron beam 200 of a second aperture image is focus-adjusted by the objective lens 207 and deflected by the deflector 208 which is controlled by the deflection control circuit 140 through the DAC 144, to reach a desired position on the target workpiece 101 placed on the XY stage 105. The XY stage 105 is movably arranged and controlled by the stage drive circuit 210.

The inside of the electron lens barrel 102 and the writing chamber 103 is exhausted by a vacuum pump (not shown), and it is controlled to be a pressure lower than an atmospheric pressure. The temperature of the writing chamber 103 is measured by the temperature sensor 242, and the pressure in it is measured by the pressure sensor 244.

Controlling the pattern writing apparatus 100 is mainly performed by the writing control unit 110, and controlling each of a large number of functions is shared by other unit device respectively. As an example of each of a large number of the function, a stage function, a diagnosis function, various daemon process functions, various control functions of control software of the pattern writing apparatus 100, etc. can be cited.

Figure 2:
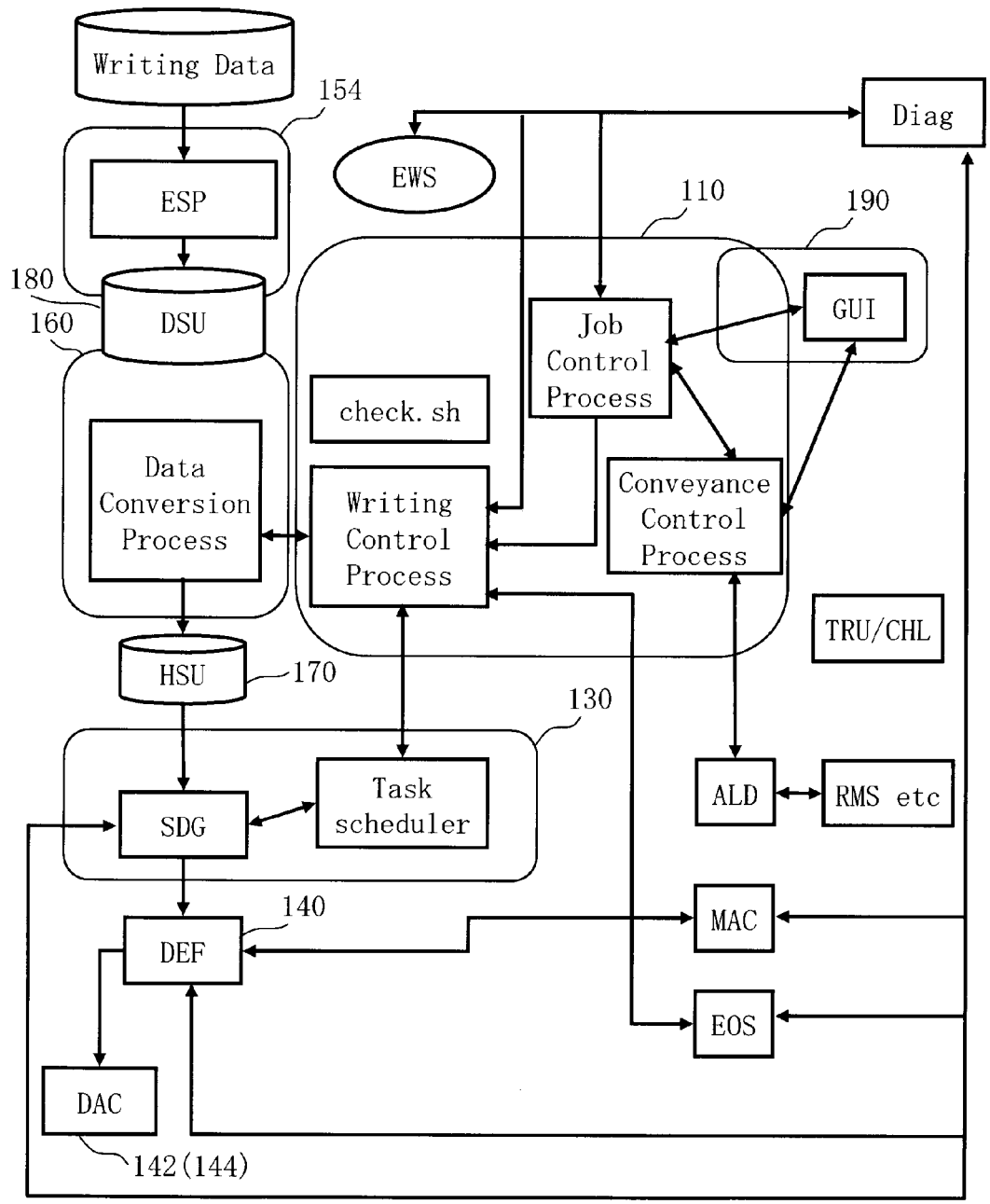
FIG. 2 is an example of functions of the pattern writing apparatus described in Embodiment 1.

FIG. 2 shows an example of the functions of the pattern writing apparatus described in Embodiment 1. In the data management calculation unit 154 shown in FIG. 2, the CPU 152 especially, as an ESP function, manages data to be input into the pattern writing apparatus 100, for example, writing data. Data to be input into the pattern writing apparatus 100 is stored in the hard disk drive unit 180. In this case, data managed by the ESP function is stored in it. In the PPU 182, the PPU 184, and the PPU 186, each CPU included in these units merges two or more chips into one chip as data conversion process function used as software operated in the pattern writing apparatus 100. Moreover, each CPU included in the PPU 182, the PPU 184, and the PPU 186 converts writing data into a format that can be input into the shot data generation unit 130 of the pattern writing apparatus 100, as the data conversion process function. Then, the data converted by the data conversion process function is stored in the high speed memory unit 170. The converted data is transmitted from the high speed memory unit 170 to the shot data generation unit 130. In the shot data generation unit 130, the CPU 132 especially generates data to be input into the hardware of the pattern writing apparatus 100, that is shot data in here, as an SDG function. Moreover, the CPU 132 controls a timing of writing the generated shot data, as a task scheduler function. Then, the shot data is sent to the deflection control circuit 140, and based on the shot data, voltage is applied to the deflector through the DAC 142 and the DAC 144. In the writing control unit 110, the CPU 120 especially executes each of process functions (software), such as writing control process, Job control process, and conveyance control process, that are mutually related and operate in the pattern writing apparatus 100. Moreover, in the operation terminal 190, a GUI (Graphic User Interface) function used as an interface for operating the pattern writing apparatus 100 is performed. In addition, functions, such as EOS (diagnosis), ALD (software and hardware for conveying a mask, the autoloader 220), MAC (software and hardware for controlling a stage), RMS (Reticle Management System), TRU/CHL (TRU, chiller, a system for supplying constant temperature water in order to control temperature) are performed. The "check.sh" function mentioned later is executed by the CPU 120.

As mentioned above, when the state of the electron beam pattern writing apparatus is changed by periodic maintenance, updating of the control program of the apparatus, debugging, etc., it becomes necessary to check operations concerning the changed contents. Then, in performing an operation check test, a dummy mode is used for a function which is not necessary for the check test. When releasing the apparatus to a customer after the operation check test, all the dummy modes need to be restored to the normal or real mode in order to execute each of the functions normally as the pattern writing apparatus. Conventionally, checking whether each function of the pattern writing apparatus is in a dummy mode or not has to be performed manually. Therefore, there are a lot of checking mistakes, and there is a case of releasing the pattern writing apparatus with a dummy mode to a customer. According to Embodiment 1, the state of the functions mentioned above is automatically checked in order not to release the pattern writing apparatus with a dummy mode to a customer.

Figure 3:
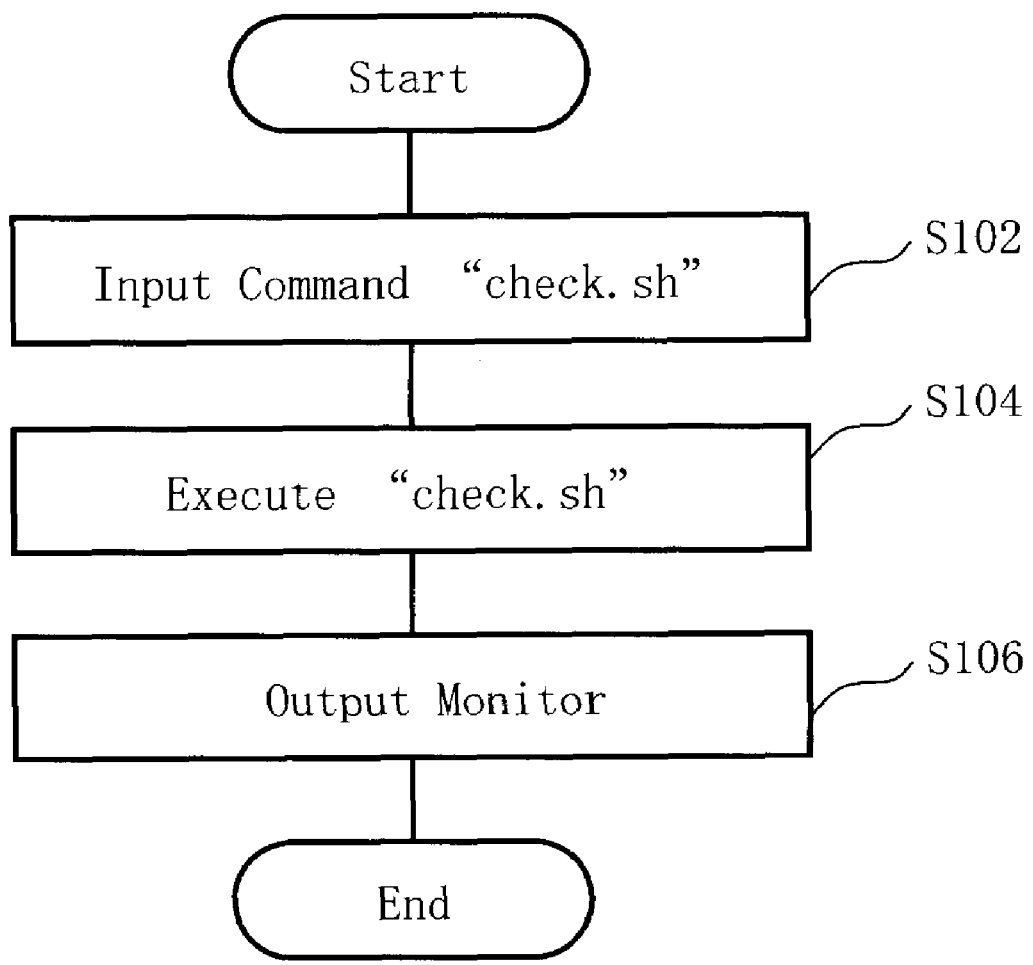
FIG. 3 is a flowchart showing main procedure of a function state checking method described in Embodiment 1.

FIG. 3 is a flowchart showing main procedures of a function state checking method described in Embodiment 1. In the figure, each of a command input step (S102), a check program execution step (S104), and a monitor output step (S106) is executed as the function state checking method.

In S(step) 102, as an input step, the input part 124 inputs a predetermined command which the user inputs by typing the K/B 192, and stores the predetermined command in the memory 122 being an example of a storage device. In the case of FIG. 3, "check.sh" (check dot shell) is input as the predetermined command.

In S104, as a check program execution step, the check part 126 reads the command "check.sh" from the memory 122, and executes the "check.sh" function used as a check program (check software), based on the command. By this "check.sh" function, the state of a predetermined function used for pattern writing using the electron beam 200 is checked. Then, the state of the checked predetermined function is stored in the memory 122. The check part 126 checks whether the state of this predetermined function is set to a dummy mode or set to an original real mode for performing a predetermined function. By creating a check program using the "sh" (shell script), it becomes easy to add a further function check. By using the shell script, it becomes unnecessary to perform converting (compile) a written program to a machine language which the computer can interpret, unlike a programming language, such as the C language. Therefore, what is necessary for adding a new function is just to write a new command in a file, thereby becoming easy to add a new function.

In S106, as a monitor output step, the output part 128 outputs (displays) the state of the checked predetermined function to the monitor 194 being an example of the output part connected to the operation terminal 190. Therefore, the user can check whether the predetermined function is set to the dummy mode or set to the real mode.

Figure 4:
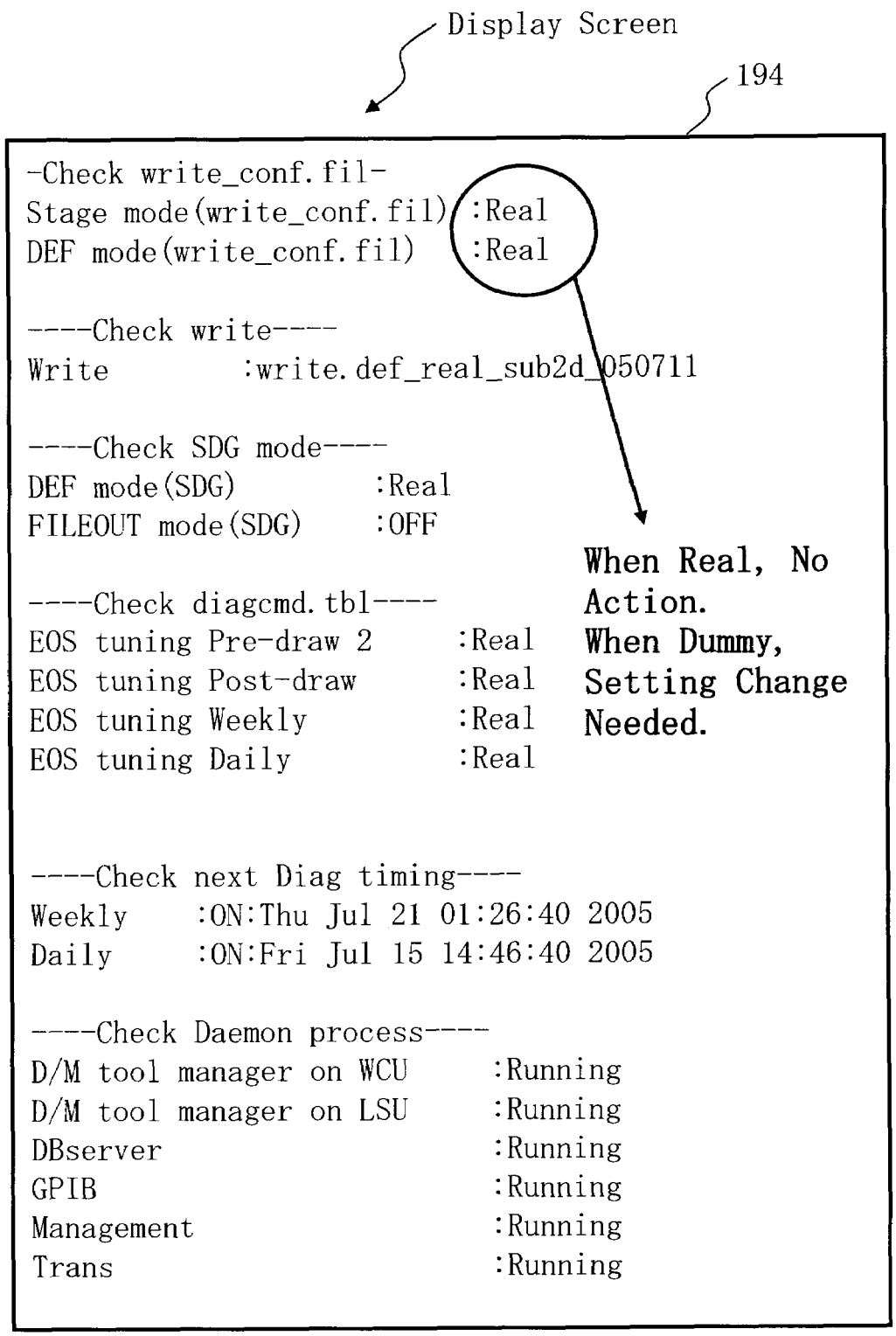
FIG. 4 shows an example of a monitor display of a state check result described in Embodiment 1.

FIG. 4 shows a monitor display example of a state check result described in Embodiment 1. In the figure, the state of each function is shown. For example, in the case of dummy writing, since driving the XY stage 105 is not required, it may be set as "use no stage." Therefore, it is necessary to check the setting state concerning the stage use whether it is to be used or not. In FIG. 4, with respect to ON or OFF of the setting state concerning the stage use, it is shown by "Stage mode (write_conf.fil)." If the state is shown as "Real", it indicates that the stage is to be used (ON setting), i.e. a normal writing state, and if the state is shown as "Dummy", it indicates that no stage is to be used (OFF setting), i.e. a dummy writing state.

Moreover, for example, in the case of dummy writing, since outputting data to the deflection control circuit 140 is not required, it may be set as "No data output to the deflection control circuit 140." Therefore, it is necessary to check the setting state concerning the data output to the deflection control circuit 140 whether it is to be output or not. In FIG. 4, with respect to ON or OFF of the setting state concerning the data output to the deflection control circuit 140, it is shown by "DEF mode (write_conf.fil)." If the state is shown as "Real", it indicates that there is a data output to the deflection control circuit 140 (ON setting), i.e. a normal writing state, and if the state is shown as "Dummy", it indicates there is no data output to the deflection control circuit 140 (OFF setting), i.e. a dummy writing state.

Moreover, for example, as a function in the writing control unit 110, the state concerning whether the XY stage 105 is to be used or not is set in the "writing control process" function. In FIG. 4, the setting state concerning whether the XY stage 105 is to be used or not is shown by "Write: write def_real . . . " If the state is shown as "real", it indicates that the stage is to be used (ON setting), i.e. a normal writing state, and if the state is shown as "dummy", it indicates that no stage is to be used (OFF setting), i.e. a dummy writing state.

Moreover, for example, as a function in the shot data generation unit 130, whether there is a data output to the deflection control circuit 140 or not is set in the "DEF mode (SDG)" function. In FIG. 4, the setting state concerning the data output to the deflection control circuit 140 is shown by "DEF mode (SDG)." If the state is shown as "Real", it indicates that there is a data output to the deflection control circuit 140 (ON setting), i.e. a normal writing state, and if the state is shown as "Dummy", it indicates that there is no data output to the deflection control circuit 140 (OFF setting), i.e. a dummy writing state.

Moreover, for example, as a function in the shot data generation unit 130, there is a debugging mode function of shot data generation unit, and whether this function can be used or not is set. In FIG. 4, the setting state of a file out mode of the shot data is shown by "FILEOUT mode (SDG)." If the state is shown as "ON", it indicates that debugging of the shot data generation unit is to be performed, and if the state is shown as "OFF", it indicates that debugging of the shot data generation unit is not to be performed, i.e. a normal writing state.

Moreover, for example, as an EOS (diagnosis) function, there are various beam adjustment functions of the pattern writing apparatus 100. For example, there are pre-adjustment and post-adjustment. As an adjustment level, there are two settings that have different adjustment cycles, for example. In FIG. 4, the setting state of pre-adjustment is shown by "EOS tuning Pre-draw 2." If the state is shown as "Real", it indicates that there is pre-adjustment (ON setting), i.e. a normal writing state, and if the state is shown as "Dummy", it indicates that there is no pre-adjustment (OFF setting), i.e. a dummy writing state. The setting state of post-adjustment is shown by "EOS tuning Post-draw." If the state is shown as "Real", it indicates that there is post-adjustment (ON setting), i.e. a normal writing state, and if the state is shown as "Dummy", it indicates that there is no post-adjustment (OFF setting), i.e. a dummy writing state. Moreover, as one of the adjustment levels, the setting state of "beam automatic adjustment command (weekly)" to be checked once a week is shown by "EOS tuning Weekly." If the state is shown as "Real", it indicates there is a once-a-week check (ON setting), i.e. a normal writing state, and if the state is shown as "Dummy", it indicates there is no once-a-week check (OFF setting), i.e. a dummy writing state. As another of the adjustment levels, the setting state of "beam automatic adjustment command (daily)" to be checked once a day is shown by "EOS tuning Daily." If the state is shown as "Real", it indicates there is a once-a-day check (ON setting), i.e. a normal writing state, and if the state is shown as "Dummy", it indicates there is no once-a-day check (OFF setting), i.e. a dummy writing state.

Moreover, the execution timing of the above adjustment is shown. In FIG. 4, the next execution timing of the "beam automatic adjustment command (weekly)" to be checked once per week is shown with the setting state (ON/OFF) of the "beam automatic adjustment command (weekly)" as "Weekly: ON: Thu. July 21 . . . " Similarly, the next execution timing of the "beam automatic adjustment command (daily)" to be checked once per day is shown with the setting state (ON/OFF) of the "beam automatic adjustment command (daily)" as "Daily: ON: Fri. July 15 . . . "

Moreover, as one of various daemon process functions, the operation state of the daemon process software "Diagnosis/Measurement tool manager (which is mentioned "D/M tool manager" after therefore)" executed in the writing control unit 110 is shown by "D/M tool manager on WCU", for example. If the state is shown as "Running", it indicates the state where the "D/M tool manager" software is running, i.e. a normal writing state. Moreover, the operation state of the daemon process software "D/M tool manager" performed in the log server unit 160 is shown by "D/M tool manager on LSU." If the state is shown as "Running", it indicates the state where the "D/M tool manager" software is running, i.e. a normal writing state.

Figure 5:
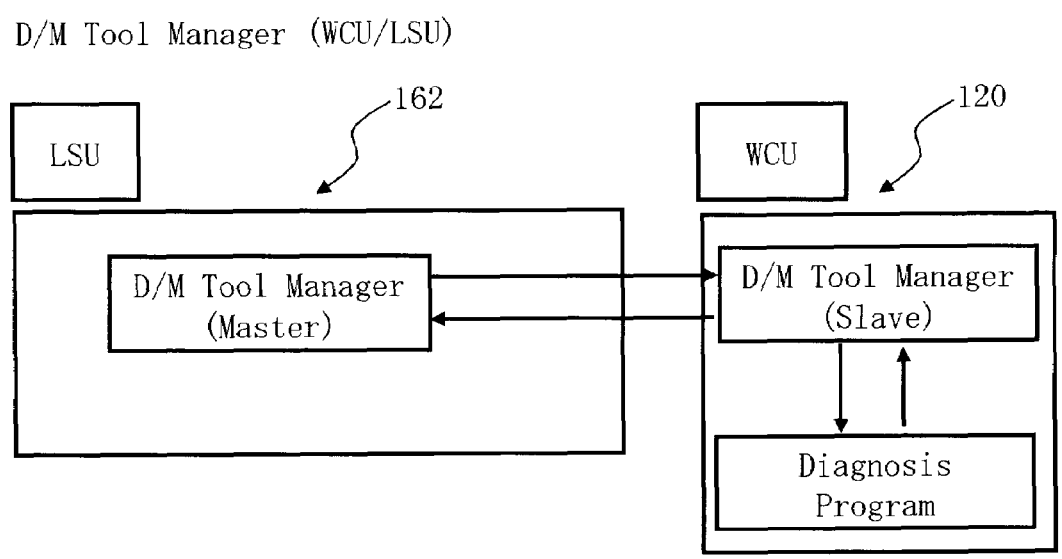
FIG. 5 shows a schematic diagram for explaining the outline of the daemon process software "Diagnosis/Measurement tool manager" described in Embodiment 1.

FIG. 5 shows a schematic diagram for explaining the outline of the daemon process software "D/M tool manager" described in Embodiment 1. As shown in FIG. 5, the daemon process software "D/M tool manager" serves as a program exchanged (controlled) between the CPU 162 in the log server unit 160 and the CPU 120 in the writing control unit 110. The D/M tool manager demon which operates on the writing control unit 110 calls a diagnosis program (daemon process software "Gpibdrv" to be mentioned later) according to an instruction of the D/M tool manager which operates on the log server unit 160, measures temperature data using the temperature sensor 242 and pressure data using the pressure sensor 244, and transfers the measurement results of the temperature, pressure, etc. to the D/M tool manager process which operates on the log server unit 160. The D/M tool manager operating on the log server unit 160 periodically outputs a measurement instruction to the D/M tool manager operating on the writing control unit 110, receives a measurement result, and stores the value of the result in the hard disk drive unit 180 used as a database.

Moreover, as one of the various daemon process functions, for example, the operation state of the daemon process software "database server" executed in the log server unit 160 is shown by "DBserver." If the state is shown as "Running", it indicates the state where the "database server" software is running, i.e. a normal writing state.

Figure 6:
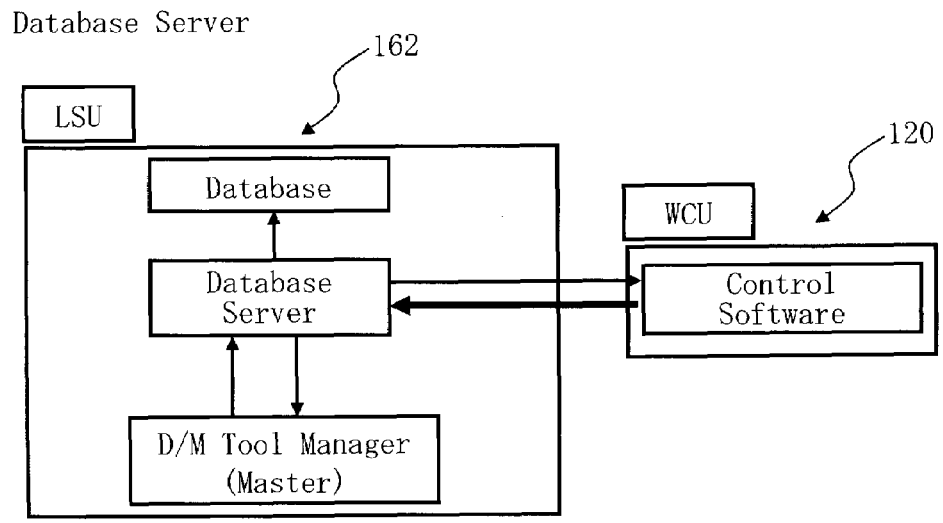
FIG. 6 shows a schematic diagram for explaining the outline of the daemon process software "database server" described in Embodiment 1.

FIG. 6 shows a schematic diagram for explaining the outline of the daemon process software "database server" described in Embodiment 1. As shown in the figure, the daemon process software "database server" serves as a program exchanged (controlled) between the CPU 162 in the log server unit 160 and the CPU 120 in the writing control unit 110. The daemon process software "database server" serves as a demon for accessing to the hard disk drive unit 180 being a database in the D/M tool manager demon mentioned above.

Moreover, as one of the various daemon process functions, for example, the operation state of the daemon process software "GPIB communication driver" executed in the writing control unit 110 is shown by "GPIB", for example. If the state is shown as "Running", it indicates the state where the "GPIB communication driver" software is running, i.e. a normal writing state.

Figure 7:
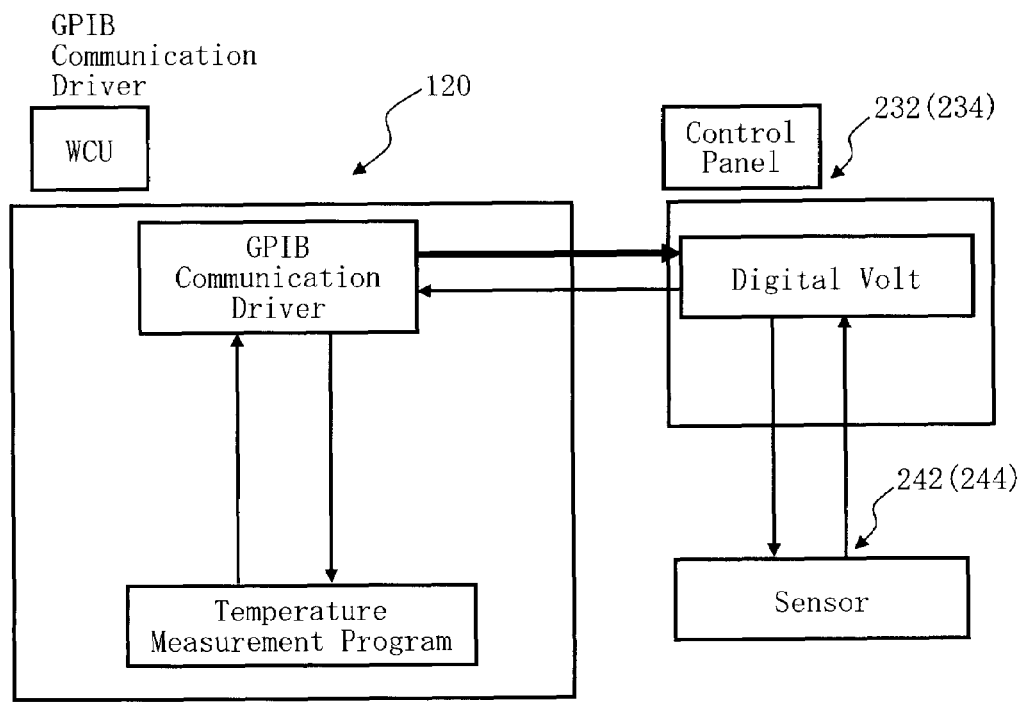
FIG. 7 shows a schematic diagram for explaining the outline of the daemon process software "GPIB communication driver" described in Embodiment 1.

FIG. 7 shows a schematic diagram for explaining the outline of the daemon process software "GPIB communication driver" described in Embodiment 1. As shown in the figure, the daemon process software "GPIB communication driver" serves as a program exchanged (controlled) between the CPU 120 in the writing control unit 110 and the driver 232 (or the driver 234). The daemon process software "GPIB communication driver" serves as a demon for communicating with external sensors, such as the temperature sensor 242 and the pressure sensor 244, and reading values from the sensors.

In FIG. 4, the operation state of the daemon process software "server process for writing data management" executed in the data management calculation unit 154 is shown by "Management." If the state is shown as "Running", it indicates the state where the "server process for writing data management" software is running, i.e. a normal writing state.

Figure 8:
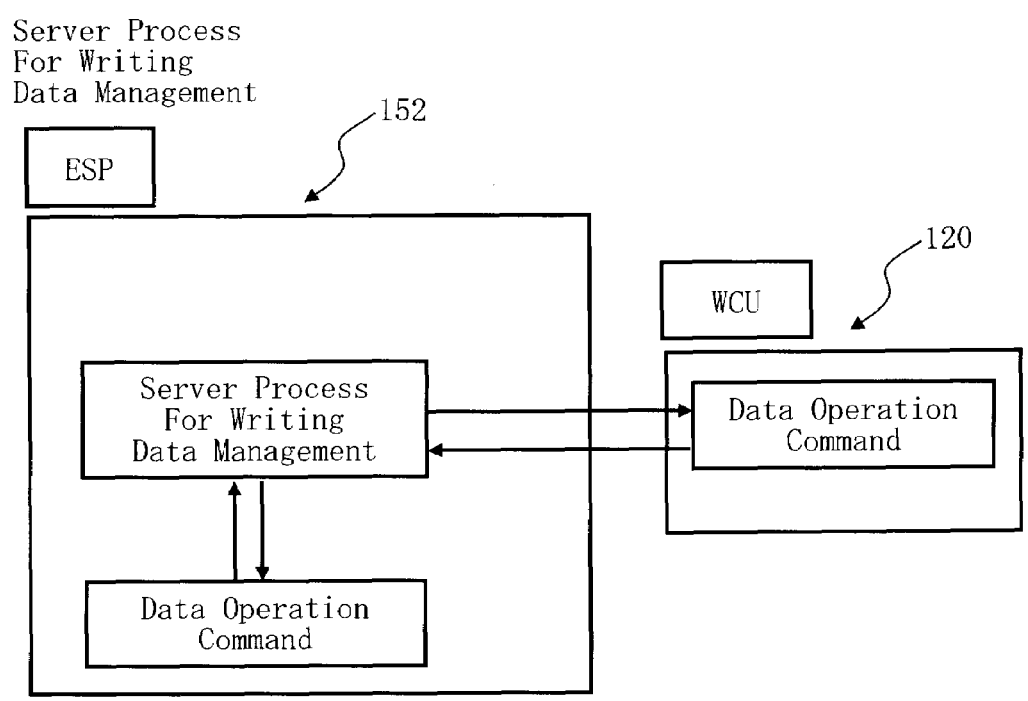
FIG. 8 shows a schematic diagram for explaining the outline of the daemon process software "server process for writing data management" described in Embodiment 1.

FIG. 8 shows a schematic diagram for explaining the outline of the daemon process software "server process for writing data management" described in Embodiment 1. As shown in the figure, the daemon process software "server process for writing data management" serves as a program exchanged (controlled) between the CPU 152 in the data management calculation unit 154 and the CPU 120 in the writing control unit 110. The daemon process software "server process for writing data management" serves as a demon for accessing data which is input into the pattern writing apparatus 100, in order to register, delete, etc. of the data.

Figure 9:
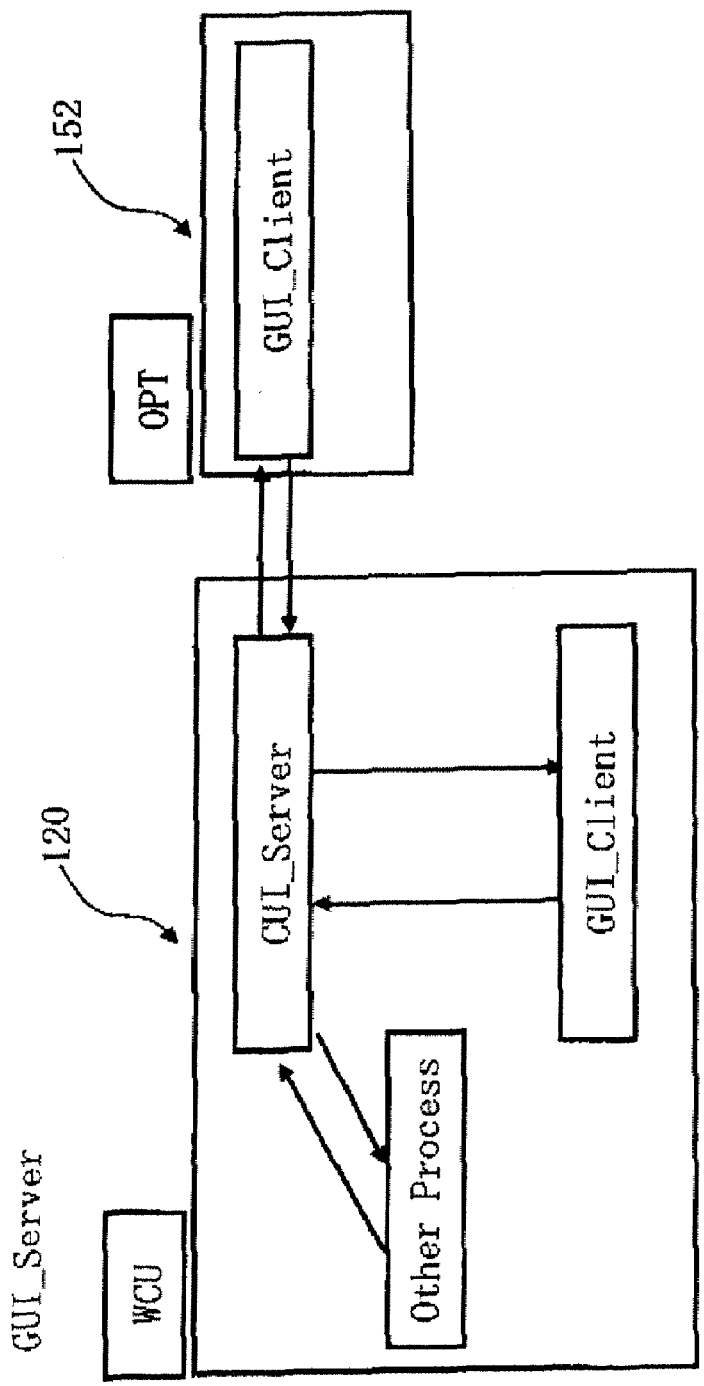
FIG. 9 shows a schematic diagram for explaining the outline of the daemon process software "GUI_Server" described in Embodiment 1.

FIG. 9 shows a schematic diagram for explaining the outline of the daemon process software "GUI_Server" described in Embodiment 1. As shown in the figure, the daemon process software "GUI_Server" serves as a program exchanged (controlled) between the CPU 120 in the writing control unit 110 and the operation terminal 190. The daemon process software "GUI_Server" serves as a demon for exchanging data with other control soft process and for updating the screen to operate the pattern writing apparatus 100. Although this daemon process software "GUI_Server" is not shown in FIG. 4, when the state is shown as "Running", it indicates the state where the "GUI_Server" software is running, i.e. a normal writing state.

Figure 10:
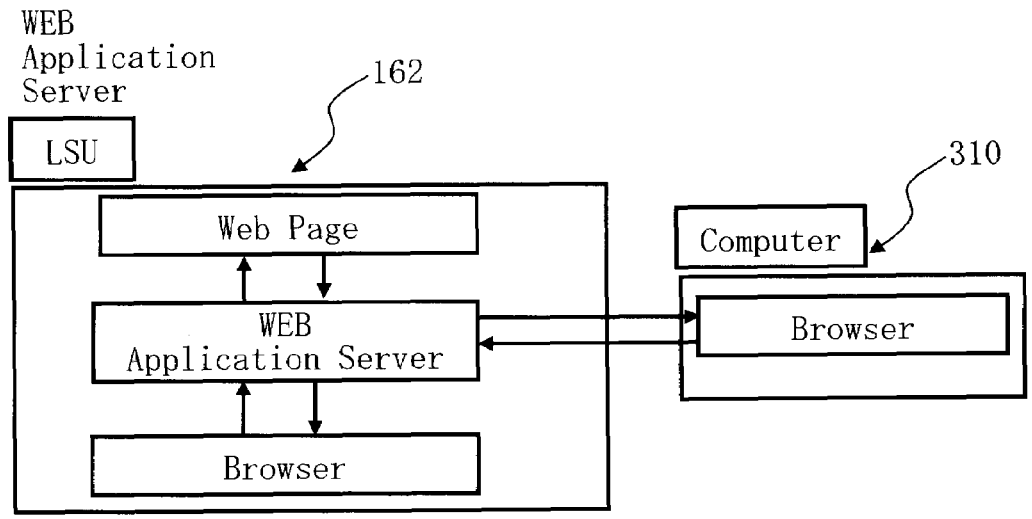
FIG. 10 shows a schematic diagram for explaining the outline of the daemon process software "WEB application server" described in Embodiment 1.

FIG. 10 shows a schematic diagram for explaining the outline of the daemon process software "WEB application server" described in Embodiment 1. As shown in the figure, the daemon process software "WEB application server" serves as a program exchanged (controlled) between the CPU 162 in the log server unit 160 and a predetermined computers 310 connected through the Internet etc. The daemon process software "WEB application server" serves as a function of a Web application server to execute a Java (registered trademark) program, such as Servlet and JSP, at the server side. Although this daemon process software "WEB application server" is not shown in FIG. 4, if the state is shown as "Running", it indicates the state where the "WEB application server" software is running, i.e. a normal writing state.

Figure 11:
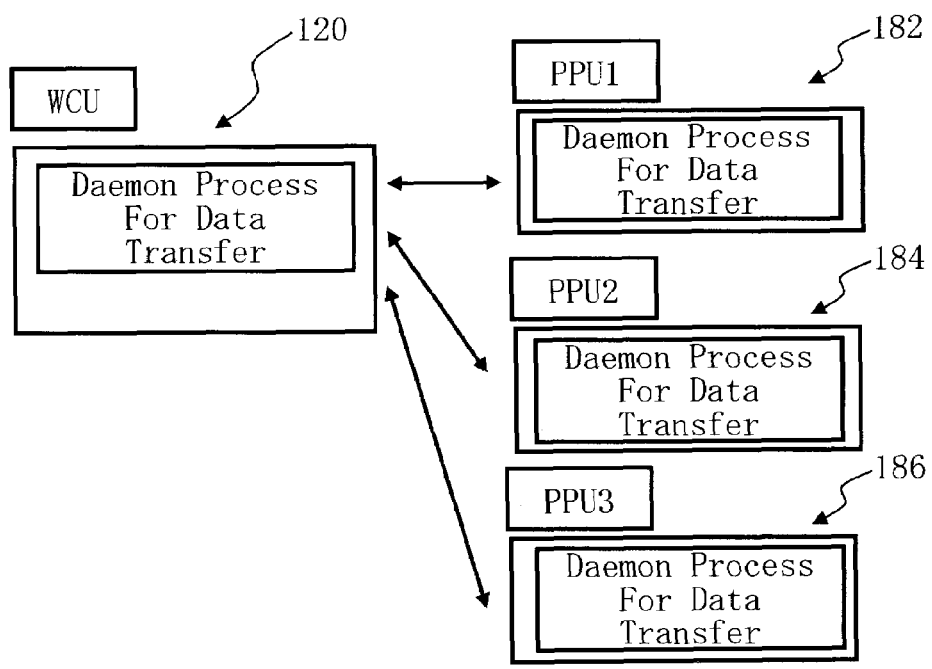
FIG. 11 shows a schematic diagram for explaining the outline of the daemon process software "daemon process for data transfer" described in Embodiment 1.

FIG. 11 shows a schematic diagram for explaining the outline of the daemon process software "daemon process for data transfer" described in Embodiment 1. As shown in the figure, the daemon process software "daemon process for data transfer" serves as a program exchanged (controlled) between the CPU 120 in the writing control unit 110 and the PPU 182, the PPU 184 or the PPU 186 being computers. The daemon process software "daemon process for data transfer" serves as a program for transferring writing data to the high-speed memory unit 170. Although this daemon process software "daemon process for data transfer" is not shown in FIG. 4, if the state is shown as "Running", it indicates the state where the "daemon process for data transfer" software is running, i.e. a normal writing state.

In addition, in FIG. 4, the operation state of the daemon process software "daemon process for communication between computers" is shown by "Trans." If the state is shown as "Running", it indicates the state where the "daemon process for communication between computers" software is running, i.e. a normal writing state.

Figure 12:
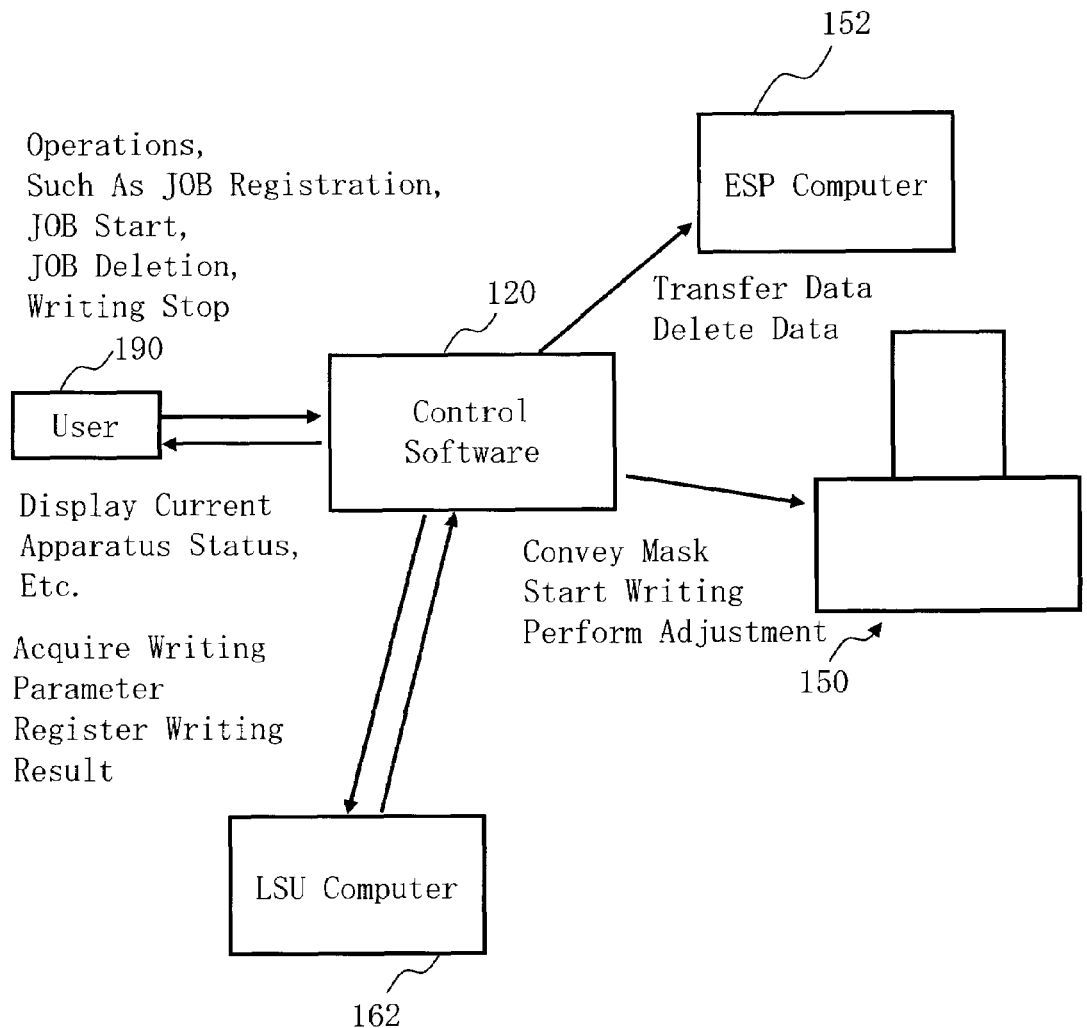
FIG. 12 shows a schematic diagram for explaining the outline of device control software described in Embodiment 1.

FIG. 12 shows a schematic diagram for explaining the outline of a device control software described in Embodiment 1. As shown in FIG. 2, various real process functions of the device control software operate in the writing control unit 110. As a function of the device control software, the CPU 120 in the writing control unit 110 receives instruction signals, such as writing JOB registration, JOB start, JOB deletion, and a writing stop, from the operation terminal 190 which the user operates. Then, the CPU 120 in the writing control unit 110 outputs a status signal concerning the current pattern writing apparatus 100 to the operation terminal 190 which the user operates, and makes the monitor 194 display it. Moreover, the CPU 120 directs the CPU 152 in the data management calculation unit 154 to transfer the data or to delete the data. Moreover, the CPU 120 directs the pattern writing part 150 being hardware to convey the target workpiece 101 such as a mask, to start writing, to execute adjusting, etc. Moreover, the CPU 120 acquires a writing parameter from the CPU 162 in the log server unit 160, outputs a writing result to the CPU 162, and makes the hard disk drive unit 180 register it.

As mentioned above, a plurality of unit devices described above are connected to the check part 126 through buses, and the check part 126 checks the state of a function controlled by each of the plurality of unit devices, and especially the operation state of a function program (second program) controlled by each unit device. When a predetermined function is performed by a predetermined unit device by using a program (second program) for the unit device concerned, whether the predetermined function is actually running or not can be confirmed in check processing by checking whether the second program is being executed in the unit device or not. Therefore, it is possible to confirm the state of a function controlled by each unit device without performing individual checking in each of the plurality of unit devices.

The check part 126 can check a setting state, that is a set value such as ON/OFF, by reading the set value stored in the hard disk drive unit 180 or a hard disk drive unit (not shown) in each unit. Regarding the operation state of a program executed in the CPU of each unit device, it can be checked by examining the internal memory (not shown) of each unit whether or not the program has been started.

As mentioned above, by inputting a predetermined command, the check part can automatically check the state of the predetermined function used for pattern writing using a charged particle beam, based on the inputted predetermined command. Then, by outputting the state after the checking, the user can confirm the state of the function. By displaying the states of various functions, such as "Real", "Dummy", "ON", "OFF", and "Running, the user can visually check the states of a large number of various functions. Thus, the user can judge whether it is possible to perform real writing or not. Moreover, the user can readjust functions in a dummy mode. As mentioned above, a daemon process and device control software operate on two or more computers (CPUs) in many cases. It is particularly difficult to check the operation state of a program which operates over two or more units. However, according to a check program of Embodiment 1, checking can be automatically performed and the user can obtain the result of the checking. Therefore, whether the function which was changed to a dummy mode at the time or after periodic maintenance, updating of the control program of the apparatus, debugging, etc. has been restored to the normal or real mode or not can be checked before releasing the pattern writing apparatus to a customer. Accordingly, writing errors and pattern errors caused by the function in a dummy mode can be eliminated or reduced.

Embodiment 2

Since the structure of the pattern writing apparatus 100 according to Embodiment 2 can be the same as that of FIG. 1, explanation for the structure will not be described. Regarding operations of a check program, only respects different from Embodiment 1 will be explained, namely respects not described are the same as those in Embodiment 1.

Figure 13:
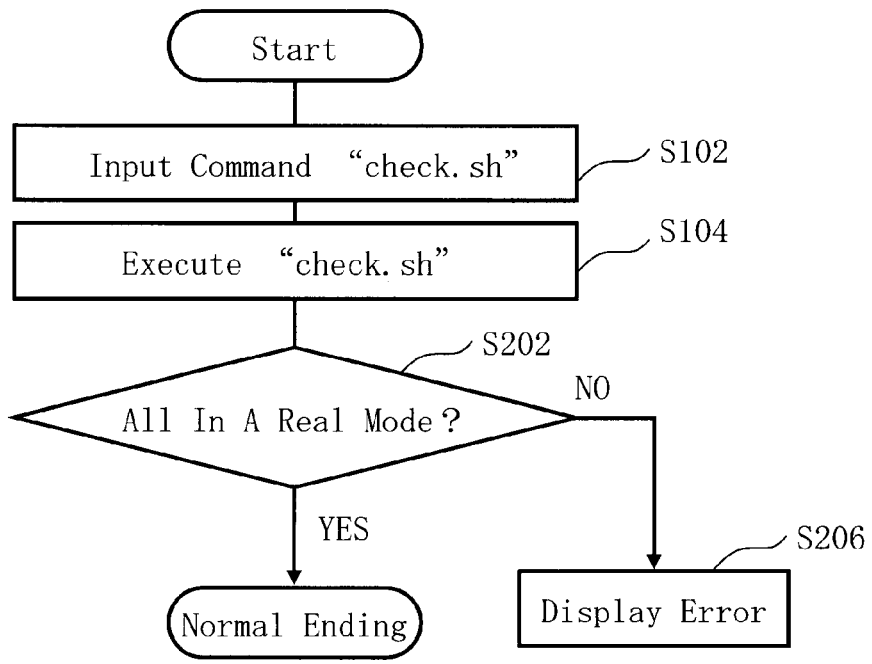
FIG. 13 is a flowchart showing main procedures of a function state checking method described in Embodiment 2.

FIG. 13 is a flowchart showing main procedures of a function state checking method described in Embodiment 2. In the figure, each of a command input step (S102), a check program execution step (S104), a REAL mode judgment step (S202), and a monitor output step (S206) is executed as the function state checking method.

In S(step) 102, as an input step, the input part 124 inputs a predetermined command and stores it in the memory 122 being an example of a storage device, similarly to Embodiment 1. In the case of FIG. 13, "check.sh" (check dot shell) is input as the predetermined command.

In S104, as a check program execution step, the check part 126 reads the command "check.sh" from the memory 122 and executes a "check.sh" function used as a check program (check software) based on the command, similarly to Embodiment 1.

In S202 according to Embodiment 2, as a REAL mode judgment step, the check part 126 judges whether all the checked functions are in a "Real" mode, i.e. a normal writing state, or not. If all the functions are in a "Real" mode, it ends normally.

In S206, as a monitor output step, when all the checked functions are not in a "Real" mode as the result of the checking, the output part 128 outputs (displays) ERROR with respect to the function not in a "Real" mode to the monitor 194 being an example of the output part connected to the operation terminal 190.

As mentioned above, since ERROR is output to the monitor only when there is a function in an error state, the user can save the time of viewing all the function states. Moreover, the user can judge whether it is possible to perform real writing or not. With respect to a function in a dummy mode, what is necessary is just to readjust it.

Embodiment 3

Since the structure of the pattern writing apparatus 100 according to Embodiment 3 can be the same as that of FIG. 1, explanation for the structure will not be described. Regarding operations of a check program, only respects different from Embodiment 1 will be explained, namely respects not described are the same as those in Embodiment 1.

Figure 14:
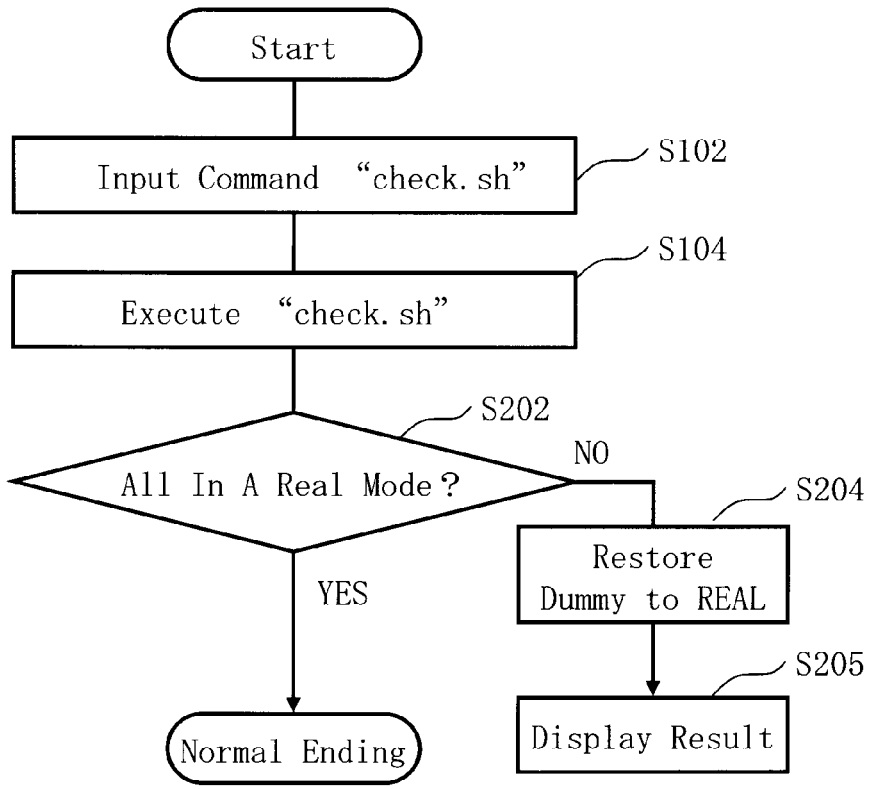
FIG. 14 is a flowchart showing main procedures of a function state checking method described in Embodiment 3.
Figure 15:
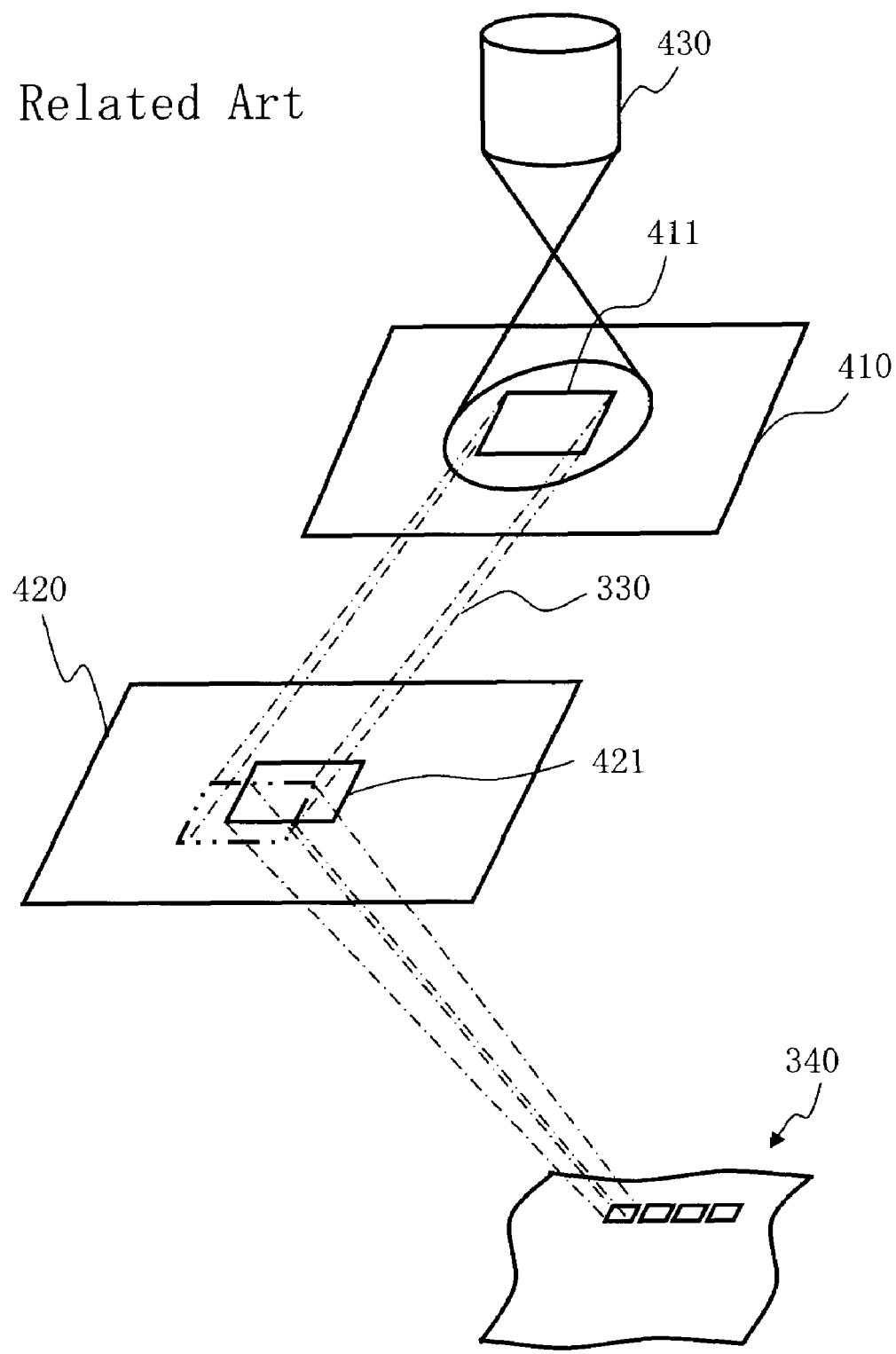
FIG. 15 shows a schematic diagram for explaining operation of a conventional variable-shaped electron beam pattern writing apparatus.

FIG. 14 is a flowchart showing main procedures of a function state checking method described in Embodiment 3. In the figure, each of a command input step (S102), a check program execution step (S104), a REAL mode judgment step (S202), a function restoration step (S204), and a monitor output step (S205) is executed as the function state checking method.

In S(step) 102, as an input step, the input part 124 inputs a predetermined command and stores it in the memory 122 being an example of a storage device, similarly to Embodiment 1. In the case of FIG. 14, "check.sh" (check dot shell) is input as the predetermined command.

In S104, as a check program execution step, the check part 126 reads the command "check.sh" from the memory 122 and executes a "check.sh" function used as a check program (check software) based on the command, similarly to Embodiment 1.

In S202 according to Embodiment 3, as a REAL mode judgment step, the check part 126 judges whether all the checked functions are in a "Real" mode, i.e. a normal writing state, or not. If all the functions are in a "Real" mode, it ends normally.

In S204, as a function restoration step, when all the checked functions are not in a "Real" mode as the result of the checking, the CPU 120 automatically restores the function which is not in a Real mode to be a function in a Real mode.

In S205, as a monitor output step, when all the checked functions are not in a "Real" mode as the result of the checking, the output part 128 outputs (displays) the automatic restoration result with respect to the function not in a "Real" mode to the monitor 194 being an example of the output part connected to the operation terminal 190.

As mentioned above, since the automatic restoration function is further provided and when there is a function in an error state, automatic restoration is performed and its result is output to the monitor, the user can save the time of adjusting a function in a dummy mode.

Processing contents and operation contents of what is expressed by "part", "unit", or "step" in the above description can be configured by a computer-executable program. It may be executed by a software program, or alternatively by any combination of software, hardware and/or firmware. When configured by a program, the program is recordable or storable onto a recording medium (not shown), such as a magnetic disk drive, a magnetic tape drive, FD, and ROM (read-only memory). For example, it is recorded on the memory 122, the hard disc drive unit 180, etc.

Moreover, each CPU serving as a computer in FIG. 1 may be connected, via a bus not shown, to a RAM (Random Access Memory), a ROM, and a magnetic disk (HD) drive unit serving as examples of a storage device, a keyboard (K/B) and a mouse serving as examples of an input means, a monitor and a printer serving as examples of an output means, or an external interface (I/F), FD, DVD, CD, etc. serving as examples of an input/output means.

As mentioned above, the embodiments have been described with reference to concrete examples. However, the present invention is not limited to these concrete examples. Although a check result is displayed on the monitor 194 in each Embodiment, it is not restricted to this, and the result may be output to a medium, such as paper.

Moreover, although description of the apparatus structure, control methods, etc. not directly required for explaining the present invention is omitted, it is possible to suitably select and use some or all of them when needed. For example, while the structure of a control unit for controlling the pattern writing apparatus 100 is not described, it should be understood that necessary control unit structure could be appropriately selected and used.

In addition, any charged particle beam pattern writing apparatus, charged particle beam writing method, or program that includes elements of the present invention and that can be appropriately modified by those skilled in the art is included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam pattern writing apparatus comprising:
    an input part configured to input a predetermined command;
    a check part configured to check a state of a predetermined function used for pattern writing using a charged particle beam, based on the predetermined command; and
    an output part configured to output the state of the predetermined function which has been checked.

2. The charged particle beam pattern writing apparatus according to claim 1, configured to be able to check its operation with plurality of functions set as dummy mode,
    wherein the check part checks whether the state of the predetermined function is set to the dummy mode or set to a real mode for performing the predetermined function.

3. The charged particle beam pattern writing apparatus according to claim 2, further comprising a plurality of unit devices that are connected to the check part through a bus,
    wherein the check part checks a state of a function controlled by each of the plurality of unit devices, as the predetermined function.

4. The charged particle beam pattern writing apparatus according to claim 2, wherein when the state of the predetermined function is set to the dummy mode as a result of checking by the check part, the dummy mode is automatically restored to the real mode.

5. The charged particle beam pattern writing apparatus according to claim 1, further comprising a stage on which a target workpiece to be written is placed,
    wherein the check part checks a setting state concerning use of the stage.

6. The charged particle beam pattern writing apparatus according to claim 5, further comprising
    a deflector configured to deflect the charged particle beam, and
    a deflection control part configured to control the deflector,
    wherein the check part checks a setting state concerning a data output to the deflection control part.

7. The charged particle beam pattern writing apparatus according to claim 6, further comprising a shot data generation unit configured to generate shot data,
    wherein the check part checks a setting state concerning use of a debugging mode function of the shot data.

8. The charged particle beam pattern writing apparatus according to claim 7, wherein the check part checks a setting state of a beam adjustment function of the charged particle beam.

9. The charged particle beam pattern writing apparatus according to claim 8, wherein the check part checks a setting state of execution timing of the beam adjustment function.

10. The charged particle beam pattern writing apparatus according to claim 1, further comprising a plurality of unit devices that are connected to the check part through a bus,
    wherein the check part checks a state of a function controlled by each of the plurality of unit devices, as the predetermined function.

11. The charged particle beam pattern writing apparatus according to claim 10, wherein the check part checks an operation state of daemon process software executed by at least one of the plurality of unit devices.

12. A computer-readable recording medium with a program recorded for causing a computer to execute processes of:
    inputting a predetermined command and storing it in a first storage device;
    reading the predetermined command from the first storage device, checking a state of a predetermined function used for pattern writing using a charged particle beam, based on the predetermined command, and storing the state of the predetermined function which has been checked in at least one of the first storage device and a second storage device; and
    displaying the state of the predetermined function which has been checked on a monitor.

13. The computer-readable recording medium with a program recorded according to claim 12, wherein the predetermined function is executed by a predetermined unit device by using a second program, and the checking includes to check whether the second program is being executed in the predetermined unit device.

* * * * *